United States Patent
Kawagoshi

(10) Patent No.: US 8,289,081 B2
(45) Date of Patent: Oct. 16, 2012

(54) DIFFERENTIAL AMPLIFIER, METHOD FOR INVERTING OUTPUT POLARITY OF THE SAME, AND SOURCE DRIVER

(75) Inventor: Hirokazu Kawagoshi, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 0 days.

(21) Appl. No.: 13/022,857

(22) Filed: Feb. 8, 2011

(65) Prior Publication Data
US 2011/0199157 A1 Aug. 18, 2011

(30) Foreign Application Priority Data

Feb. 12, 2010 (JP) ................................ 2010-028420

(51) Int. Cl.
*H03F 3/45* (2006.01)
(52) U.S. Cl. ...................... 330/261; 345/204
(58) Field of Classification Search .................. 330/261; 345/204
See application file for complete search history.

(56) References Cited

U.S. PATENT DOCUMENTS

| 6,046,633 A * | 4/2000 | Shimizu ......................... 330/51 |
| 6,850,232 B2 * | 2/2005 | Tazuke .......................... 345/204 |
| 7,199,662 B2 | 4/2007 | Seko |

FOREIGN PATENT DOCUMENTS

JP 2005-175994 A 6/2005

* cited by examiner

Primary Examiner — Steven J Mottola
(74) Attorney, Agent, or Firm — Foley & Lardner LLP

(57) ABSTRACT

A differential amplifier includes: an output amplifier circuit; a bias circuit; and a pulse applying circuit. The output amplifier circuit receives a positive gradation voltage and a negative gradation voltage alternately by an input stage circuit and supplies a drive voltage generated based on the gradation voltage to a display panel. The bias circuit generates a bias voltage in synchronization with a strobe signal which is a trigger for a polarity inverting operation of the gradation voltage and applies the bias voltage to a constant current source controlling a current of the input stage circuit. The pulse applying circuit generates a pulse voltage having a voltage level higher than a voltage level of the bias voltage and couples the pulse voltage to the bias voltage.

19 Claims, 5 Drawing Sheets

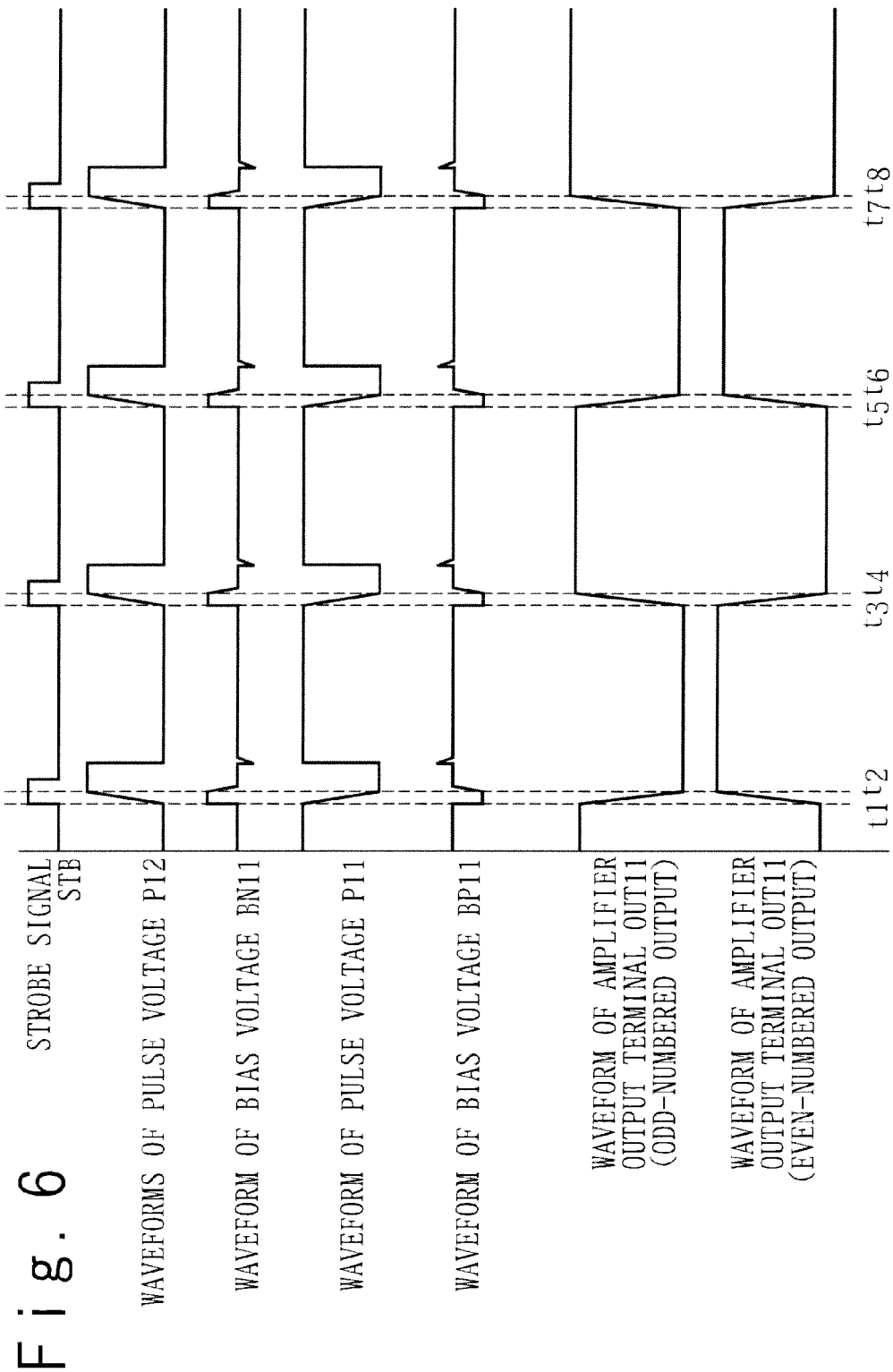

DIFFERENTIAL AMPLIFIER, METHOD FOR INVERTING OUTPUT POLARITY OF THE SAME, AND SOURCE DRIVER

INCORPORATION BY REFERENCE

This application is based upon and claims the benefit of priority from Japanese patent application No. 2010-028420 filed on Feb. 12, 2010, the disclosure of which is incorporated herein in its entirety by reference.

BACKGROUND OF THE INVENTION

1. Field of the Invention

The present invention relates to a differential amplifier with a high slew rate.

2. Description of Related Art

In recent years, a liquid crystal display increasingly has a larger screen and a higher definition. Consequently, a liquid crystal display is provided with a greater number of differential amplifier circuits for example. A source driver provided in a liquid crystal display is required to have a capacity to drive a greater load faster without increasing power consumption.

Japanese patent application No. JP-P 2005-175994A (Patent literature 1: corresponding to U.S. Pat. No. 7,199,662 (B2)) discloses an output circuit which reduces a consumption current of an operational amplifier and which reduces distortion of an output waveform of the operational amplifier. The output circuit according to the patent literature 1 will be described below with reference to FIGS. 1 to 3.

FIG. 1 is a circuit diagram showing a push-pull output operational amplifier 1 provided in a one-amplifier output circuit according to the patent literature 1. The operational amplifier 1 in FIG. 1 outputs both a rising waveform and a falling waveform. FIG. 1 shows one of a plurality of operational amplifiers provided in the output circuit. The operational amplifier 1 has a terminal 11 and a terminal 12. The terminal 11 supplies a bias voltage VbiasA to an N-channel MOS transistor Q5 provided in the operational amplifier 1. The terminal 12 supplies a bias voltage VbiasB to a P-channel MOS transistor Q15 provided in the operational amplifier 1. The operational amplifier 1 improves a slew rate at the time of rising and falling of an output signal, by being supplied with the bias voltages VbiasA and VbiasB to the terminals 11 and 12 respectively.

FIG. 2 is a circuit diagram showing a bias circuit 2 in the patent literature 1. The bias circuit 2 supplies the bias voltages VbiasA and VbiasB to the operational amplifier 1. The bias circuit 2 supplies the bias voltage VbiasA to the terminal 11 of the operational amplifier 1 through an N-bias line 25. The bias circuit 2 supplies the bias voltage VbiasB to the terminal 12 of the operational amplifier 1 through a P-bias line 26. The bias circuit 2 has a bias current source 21, a bias voltage obtaining circuit 22, a precharge circuit 23, and a precharge power source 24.

The bias current source 21 is a low-bias bias current source without switching of a high bias and a low bias. The bias current source 21 includes a P-channel MOS transistor Q21. The bias current source 21 is set to meet a condition that on-state resistance R1 can control the operational amplifier so that the operational amplifier has a low bias.

The bias voltage obtaining circuit 22 has N-channel MOS transistors Q23, Q24, and Q27, and P-channel MOS transistors Q25 and Q26. The MOS transistor Q23 is connected between the bias current source 21 and a low-voltage-side terminal VSS. The MOS transistor Q24 is connected to the MOS transistor Q23 through mirror connection. The MOS transistor Q25 is connected in series to the MOS transistor Q24 between a high-voltage-side terminal VDD and the low-voltage-side terminal VSS. The MOS transistor Q26 is connected to the MOS transistor Q25 through mirror connection. The MOS transistor Q27 is connected in series to the MOS transistor Q26 between the high-voltage-side terminal VDD and the low-voltage-side terminal VSS. The series connection point between the MOS transistors Q26 and Q27 serves as output to the N-bias line 25. The series connection point between the MOS transistors Q24 and Q25 serves as output to the P-bias line 26.

The precharge circuit 23 has precharge capacitors Cn and Cp, an N-channel MOS transistor Q28, and a P-channel MOS transistor Q29. The capacitor Cn is connected between the low-voltage-side terminal VSS and the series connection point between the MOS transistors Q26 and Q27. The capacitor Cp is connected between the high-voltage-side terminal VDD and the series connection point between the MOS transistors Q24 and Q25. The N-channel MOS transistor Q28 supplies a precharge voltage Vpn from the precharge power source 24 to the capacitor Cn. The P-channel MOS transistor Q29 supplies a precharge voltage Vpp from the precharge power source 24 to the capacitor Cp. The MOS transistor Q28 is controlled by a timing signal Tp. The MOS transistor Q29 is controlled by an inversion signal of the timing signal Tp through an inverter INV.

The precharge power source 24 outputs the precharge voltages Vpn and Vpp. The precharge voltages Vpn and Vpp are adjusted at desired voltages by control signals (not shown).

FIG. 3 is a timing chart showing operations of the operational amplifier 1 and the bias circuit 2 in the patent literature 1. The capacitors Cn and Cp start electric charge with the precharge power source 24 at time T1 when a pulse waveform of the timing signal Tp rises. Consequently, the bias circuit 2 outputs a high bias voltage. The capacitors Cn and Cp start electric discharge at time T2 when the pulse waveform of the timing signal Tp falls.

At the time T2, the operational amplifier 1 starts rising and falling of output waveforms. At this time, the output waveforms of the operational amplifier 1 steeply rise and fall due to a high bias from the bias circuit 2. The bias voltage from the bias circuit 2 shifts from a high bias to a low bias based on curves of CR time constants of discharge paths of the capacitors Cn and Cp. Therefore, a high slew rate shifts to a low slew rate as rising and falling of an output wave form come closer to a given voltage, making it possible to reduce distortion of an output waveform.

Bias voltages at the time of rising and falling of an output waveform of the operational amplifier 1 are attenuated at curves of CR time constants of discharge paths of the capacitors Cn and Cp. For this reason, a consumption current of the operational amplifier 1 is reduced compared with an output circuit to which a high bias of the same level is supplied over a given period of time. It is also possible to minutely set control of bias currents at the time of rising and falling of an output waveform of the operational amplifier 1 since the precharge voltages Vpn and Vpp from the precharge power source 24 are variable.

The inventor has now discovered the following facts. However, there is a possibility that the bias circuit 2 in the patent literature 1 causes oscillation of the operational amplifier 1. This is because in the bias circuit 2 in the patent literature 1, a time period during which a bias voltage is high is long since a bias voltage is increased once before the polarity of an amplifier output is inverted. In addition, the consumption current during a time period in which the timing signal Tp is at a high level is greater since a time period during which a bias voltage is high is long.

SUMMARY

The present invention seeks to solve one or more of the above problems, or to improve upon those problems at least in part.

In one embodiment, a differential amplifier includes: an output amplifier circuit configured to receive a positive gradation voltage and a negative gradation voltage alternately by an input stage circuit and supply a drive voltage generated based on the gradation voltage to a display panel; a bias circuit configured to generate a bias voltage in synchronization with a strobe signal which is a trigger for a polarity inverting operation of the gradation voltage and apply the bias voltage to a constant current source controlling a current of the input stage circuit; and a pulse applying circuit configured to generate a pulse voltage having a voltage level higher than a voltage level of the bias voltage and couple the pulse voltage to the bias voltage.

In another embodiment, a source driver includes: a differential amplifier, wherein the differential amplifier includes: an output amplifier circuit configured to receive a positive gradation voltage and a negative gradation voltage alternately by an input stage circuit and supply a drive voltage generated based on the gradation voltage to a display panel; a bias circuit configured to generate a bias voltage in synchronization with a strobe signal which is a trigger for a polarity inverting operation of the gradation voltage and apply the bias voltage to a constant current source controlling a current of the input stage circuit; and a pulse applying circuit configured to generate a pulse voltage having a voltage level higher than a voltage level of the bias voltage and couple the pulse voltage to the bias voltage.

In another embodiment, a method for inverting an output polarity of a differential amplifier, comprising: generating a drive voltage based on a positive gradation voltage and a negative gradation voltage received alternately by an input stage circuit; supplying the drive voltage to a display panel; generating a bias voltage in synchronization with a strobe signal which is a trigger for a polarity inverting operation of the gradation voltage; applying the bias voltage to a constant current source controlling a current of the input stage circuit; generating a pulse voltage having a voltage level higher than a voltage level of the bias voltage: and coupling the pulse voltage to the bias voltage.

According to the present invention, it is possible to achieve a differential amplifier capable of achieving a high slew rate without increasing power consumption while preventing oscillation of the differential amplifier.

BRIEF DESCRIPTION OF THE DRAWINGS

The above and other objects, advantages and features of the present invention will be more apparent from the following description of certain preferred embodiments taken in conjunction with the accompanying drawings, in which:

FIG. 6 is a timing chart showing an operation of the differential amplifier according to the embodiment of the present invention.

DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposed.

A differential amplifier according to an embodiment of the present invention will be described below with reference to the attached drawings.

[General Description]

A differential amplifier according to the embodiment of the present invention includes: an output amplifier, a bias circuit and a pulse applying circuit. The bias circuit supplies a bias voltage to the output amplifier. The pulse applying circuit couples a pulse voltage to a bias line for supplying the bias voltage. The differential amplifier may be applied to (incorporated in) a liquid crystal display driver IC. The pulse applying circuit applies a pulse voltage synchronized with a strobe signal, which is an output inversion operation signal of the differential amplifier, to a bias line through a coupling capacitor. As a result, a bias voltage applied to the output amplifier is temporarily increased. It is possible to raise a slew rate of the output amplifier since current supplying capacity of a constant current source provided in an input differential stage circuit can be increased due to an increase in the bias voltage.

The pulse applying circuit temporarily applies a pulse voltage. For this reason, a state where a bias voltage is high does not continue long, and the output amplifier does not get into oscillation. As a result, the output amplifier can operate stably. Additionally, increase of a consumption current can be prevented since application of a pulse voltage is temporary.

[Application to a Source Driver]

Figure 1:
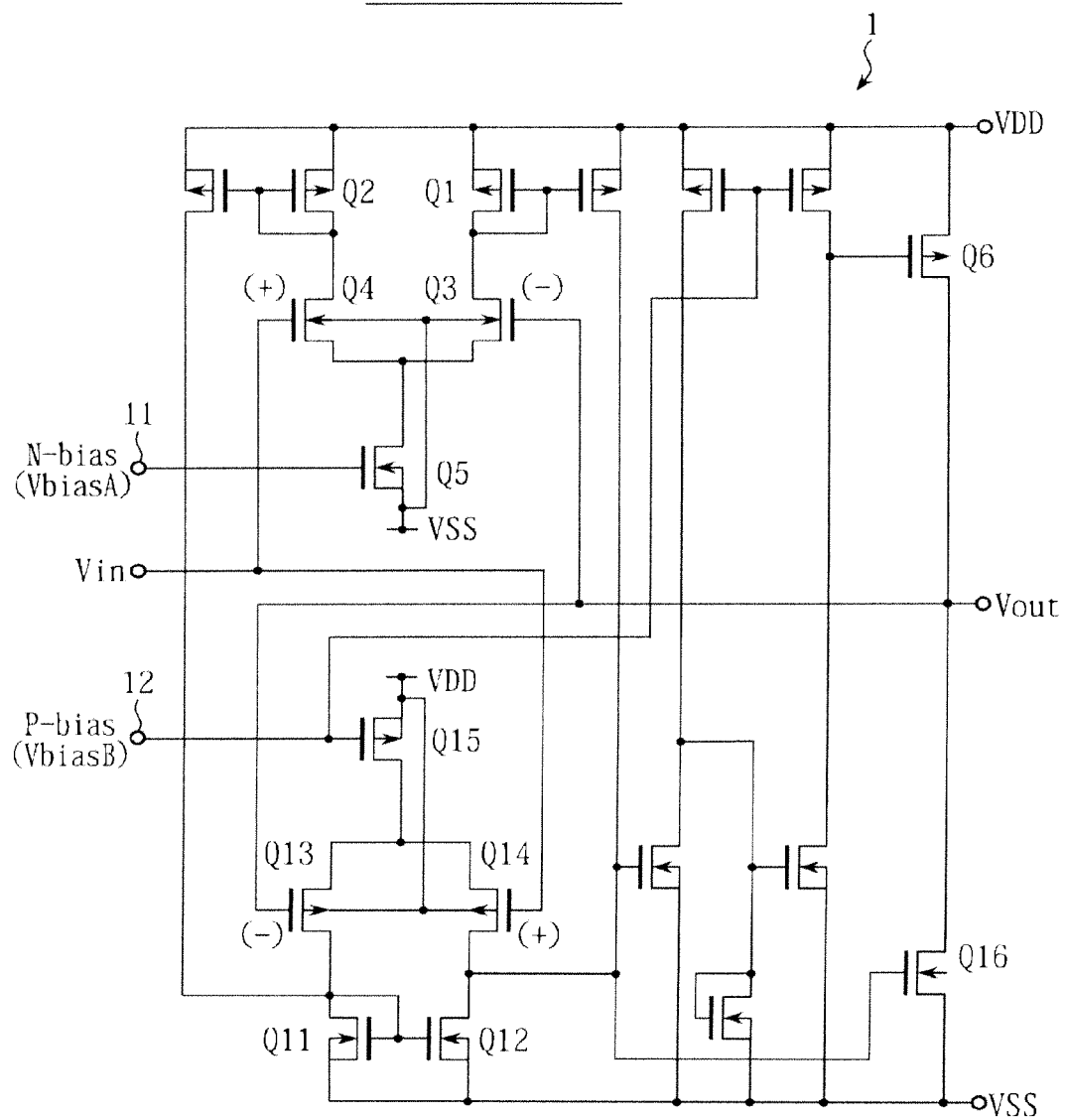
FIG. 1 is a circuit diagram showing a push-pull output operational amplifier 1 provided in a one-amplifier output circuit in Patent literature 1.
Figure 2:
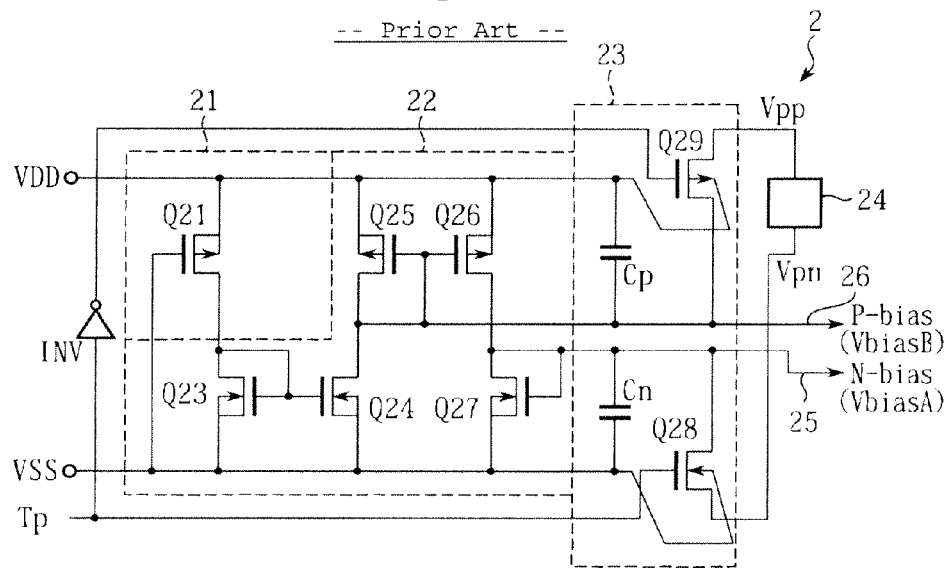
FIG. 2 is a circuit diagram showing a bias circuit 2 in Patent literature 1.
Figure 3:
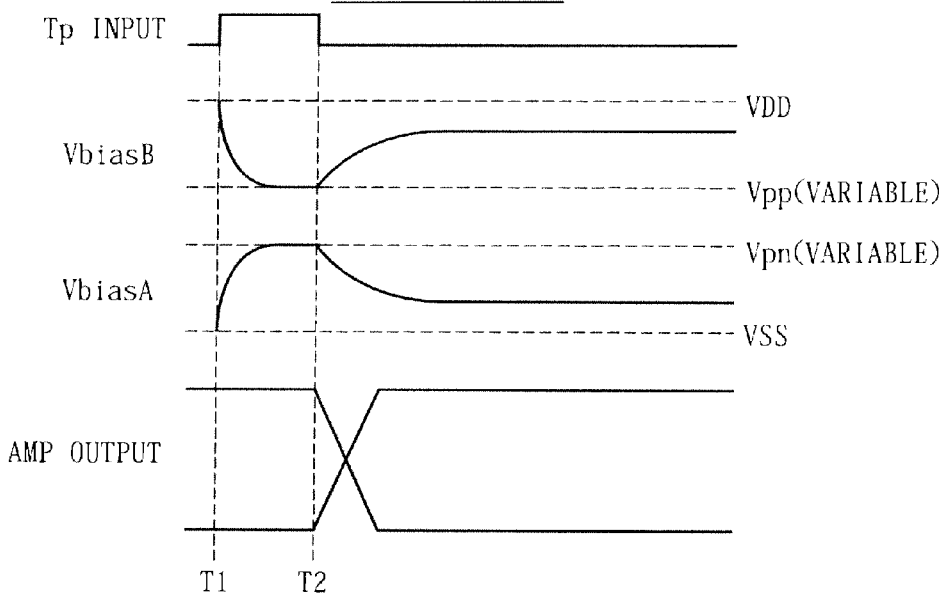
FIG. 3 is a timing chart showing operations of the operational amplifier 1 and the bias circuit 2 in Patent literature 1.
Figure 4:
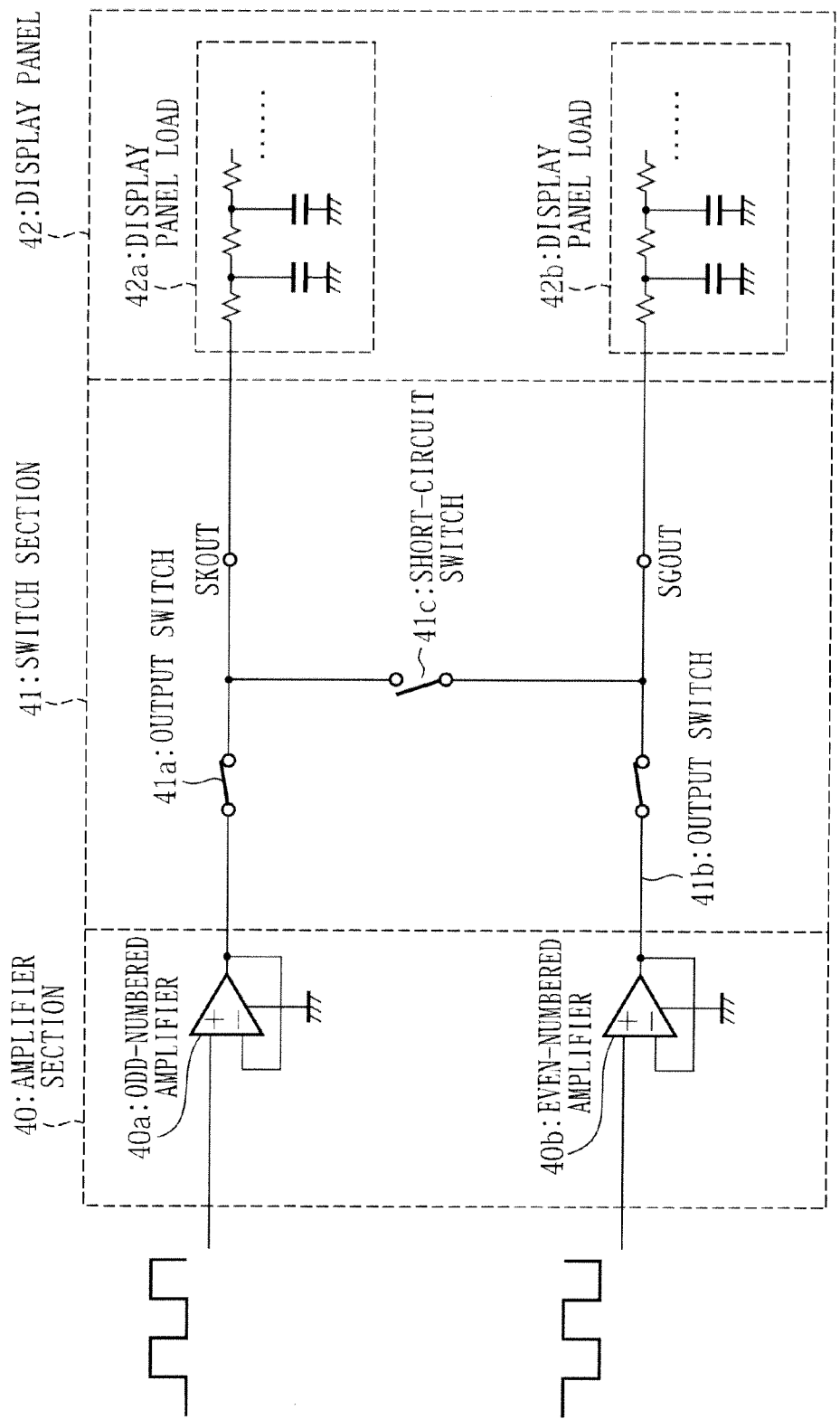
FIG. 4 is a schematic circuit diagram showing a configuration of a source driver to which a differential amplifier according to an embodiment of the present invention is applied.

The differential amplifier according to the embodiment of the present invention is applicable to a source driver for a liquid crystal display with an inversion driving method (hereinafter referred to as a source driver). FIG. 4 shows a configuration of a source driver to which the differential amplifier according to the embodiment of the present invention is applied. The source driver shown in FIG. 4 includes an amplifier section 40 and a switch section 41. Though only two output amplifiers are shown in FIG. 4, output amplifiers, the number of which corresponds to the number of data lines of a display panel 42, are provided in practice. In this case, the differential amplifier according to the embodiment of the present invention is applied to the source driver as the output amplifier (40a, 40b) in the amplifier section 40.

First, the amplifier section 40 includes output amplifiers 40a and 40b. The output amplifiers 40a and 40b are provided in correspondence to data lines. Each of the output amplifiers 40a and 40b configures a voltage follower. The output amplifiers 40a and 40b are supplied with a positive gradation voltage and a negative gradation voltage generated based on display signals by an image LSI (not shown) alternately at a positive input terminal to generate drive signals and output the drive signals to the switch section 41. The output amplifiers 40a (odd-numbered amplifiers) provided in odd-numbered rows and the output amplifiers 40b (even-numbered amplifiers) provided in even-numbered rows supply gradation voltages of which polarities are different from each other.

Next, the switch section 41 includes output switches 41a and 41b, and a short-circuit switch 41c. The output switches 41a and 41b are provided in correspondence to the output amplifiers 40a and 40b. The short-circuit switch 41c short-circuits a data line in an odd-numbered row and a data line in an even-numbered row.

Next, the display panel 42 includes display panel loads 42a and 42b. The display panel load 42a corresponds to the output amplifier 40a. The display panel load 42b corresponds to the output amplifier 40b. The display panel loads 42a and 42b are driven by drive signals outputted from the output amplifiers 40a and 40b through output terminals SKOUT and SGOUT respectively.

In the source driver having the above configuration, an output polarity switching (inverting) period comes when a strobe signal STB is at the high level. The output switches 41a and 41b are open when the strobe signal STB is at the high level. The short-circuit switch 41c causes a short circuit when the strobe signal STB gets into the high level. Consequently, in the output polarity switching period when the strobe signal STB is at the high level, data lines in an odd-numbered row and an even-numbered row are short-circuited by the short-circuit switch 41c while the amplifier section 40 and the switch section 41 are disconnected, and charges are averaged between the adjacent data lines.

When the strobe signal STB is at the low level, the amplifier section 40 and the switch section 41 are connected and a gradation voltage applying period comes. The output amplifiers 40a and 40b apply drive signals which correspond to gradation voltages after switching of the respective input polarities, to data lines. Each data line can drive each load of the display panel 42 at high speed with a drive signal, since charges are averaged in the switching period.

The above is the description of the source driver to which the differential amplifier according to the embodiment of the present invention is applied. Note that a source driver to which the differential amplifier according to the embodiment of the present invention can be applied is not limited to the source driver shown in FIG. 4. The differential amplifier according to the embodiment of the present invention is widely applicable to source drivers using the inversion driving method.

[Configuration]

Figure 5:
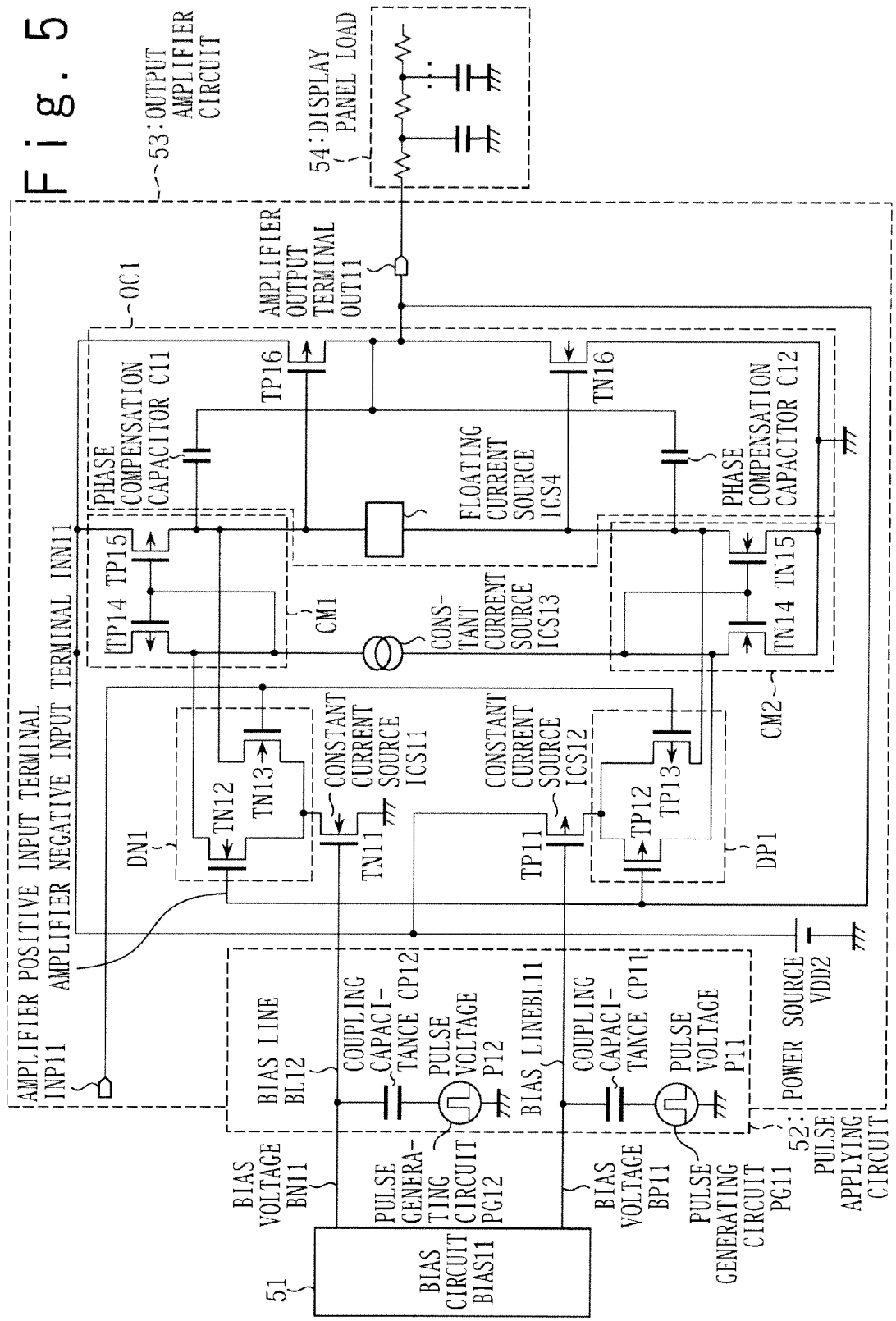
FIG. 5 is a circuit diagram showing a configuration of a differential amplifier according to the embodiment of the present invention.

Next, a configuration of the differential amplifier according to the embodiment of the present invention will be described. FIG. 5 is a circuit diagram showing a configuration of the differential amplifier according to the embodiment of the present invention. The differential amplifier according to the embodiment includes a bias circuit 51, a pulse applying circuit 52, and an output amplifier circuit 53.

First, the bias circuit 51 supplies bias voltages BP11 and BN11, which are based on the strobe signal STB (the trigger for an output polarity switching (inverting) operation of the output amplifier circuit 53), to the output amplifier circuit 53 through bias lines BL11 and BL12.

Next, in the output amplifier circuit 53, a positive gradation voltage and a negative gradation voltage generated based on a display signal from an image LSI (not shown) are alternately supplied to a positive input terminal INP11. The output amplifier circuit 53 supplies a drive signal generated based on the gradation voltage from an amplifier output terminal OUT11 to a display panel load 54 through a data line. A configuration of the output amplifier circuit 53 shown in FIG. 5 will be described below.

The output amplifier circuit 53 shown in FIG. 5 includes a first differential pair circuit DN1, a second differential pair circuit DP1, a first current mirror circuit CM1, a second current mirror circuit CM2, constant current sources ICS11, ICS12 and ICS13, a floating current source ICS4 and an output stage circuit OC1. Here, the first differential pair circuit DN1 and the second differential pair circuit DP1 are also referred to as an input stage circuit. The constant current sources ICS11 and ICS12 may be included in the input stage circuit.

The first differential pair circuit DN1 includes paired two N-channel MOS transistors TN12 and TN13. The gate of the MOS transistor TN 12 is connected to a negative input terminal INN11 to which output of the output amplifier circuit 53 is fed back. The gate of the MOS transistor TN 13 is connected to the positive input terminal INP11 of the output amplifier. The drains of the MOS transistors TN 12 and TN13 are connected to an input and an output of the current mirror circuit CM1.

The sources of the MOS transistors TN12 and TN13 are connected in common to the drain of an N-channel MOS transistor TN11 configuring a constant current source ICS11. The source of the MOS transistor TN11 is connected to a negative power source VSS2. The gate of the MOS transistor TN11 is connected to the bias line BL12 and supplied with the bias voltage BN11 from the bias circuit BIAS51.

The second differential pair circuit DP1 includes paired two P-channel MOS transistors TP12 and TP13. The gate of the MOS transistor TP12 is connected to the negative input terminal INN11 to which output of the output amplifier circuit 53 is fed back. The gate of the MOS transistor TP13 is connected to the positive input terminal INP11 of the output amplifier. The drains of the MOS transistors TP12 and TP13 are connected to an input and an output of the current mirror circuit CM2.

The sources of the MOS transistors TP12 and TP13 are connected in common to the drain of a P-channel MOS transistor TP11 configuring a constant current source ICS12. The source of the MOS transistor TP11 is connected to a positive power source VDD2. The gate of the MOS transistor TP11 is connected to the bias line BL11 and supplied with the bias voltage BP11 from the bias circuit BIAS51.

The first current mirror circuit CM1, which is provided between the positive power source VDD2 and the first differential pair circuit DN1, includes two diode-connected P-channel MOS transistors TP14 and TP15. The second current mirror circuit CM2, which is provided between the negative power source VSS2 and the second differential pair circuit DP1, includes two diode-connected N-channel MOS transistors TN14 and TN15.

The output stage circuit OC1 includes a P-channel MOS transistor TP16 and an N-channel MOS transistor TN16 provided in series between the positive power source VDD2 and a negative power source VSS2. The drains of the MOS transistors TP16 and TN16 are connected in common, and the connection point serves as the amplifier output terminal OUT11 of the output amplifier circuit 53. The floating current source ICS14 is provided between the gates of the MOS transistors TP16 and TN16. A phase compensation capacitor C11 is provided between the gate of the MOS transistor TP16 and the amplifier output terminal OUT11, and a phase compensation capacitor C12 is provided between the gate of the MOS transistor TN16 and the amplifier output terminal OUT11.

The constant current source ICS13 is provided between the first current mirror circuit CM1 and the second current mirror circuit CM2.

In the output amplifier circuit 53 having the above configuration, a slew rate at the time of polarity switching of a drive signal (output) is determined by amounts of the current flowing through the constant current sources ICS11 and ICS12 and capacitances of the phase compensation capacitors C11 and C12. As the amounts of the current flowing through the constant current sources ICS11 and ICS12 are increased, charging times for the phase compensation capacitors C11 and C12 are shorter. Therefore, by increasing the bias voltages BN11 and BP11 which serve as gate voltages of the constant current sources ICS11 and ICS12, it is possible to increase current supplying capacity of the constant current sources ICS11 and ICS12 and increase a slew rate of the output amplifier circuit 53. Note that the configuration of the output amplifier circuit 53 shown in FIG. 5 is just one example, and a configuration of the output amplifier circuit 53 is not limited to this example. The output amplifier circuit 53 having another configuration is also applicable provided that a slew rate of the output amplifier circuit 53 is determined by the constant current sources ICS11 and ICS12 and the phase compensation capacitors C11 and C12.

Next, the pulse applying circuit 52 couples pulse voltages to the bias voltages BN11 and BP11 applied from the bias circuit 51. The pulse applying circuit 52 includes pulse generating circuits PG11 and PG12 and coupling capacitances CP11 and CP12. The pulse generating circuit PG11 is connected to the coupling capacitance CP11, and the coupling capacitance CP11 is connected to the bias line BL11. The pulse generating circuit PG12 is connected to the coupling capacitance CP12, and the coupling capacitance CP12 is connected to the bias line BL12. Note that the coupling capacitances CP11 and CP12 can be divided and positioned in free areas of a chip. Additionally, the coupling capacitance CP11 may be parasitic capacitance caused in a line connecting the pulse generating circuit PG11 and the bias line BL11. Similarly, the coupling capacitance CP12 may be parasitic capacitance caused in a line connecting the pulse generating circuit PG12 and the bias line BL12.

The pulse generating circuits PG11 and PG12 generate pulse voltages P11 and P12 respectively, in synchronization with the strobe signal STB. The pulse voltages P11 and P12 are coupled to the bias voltages BP11 and BN11 by the coupling capacitances CP11 and CP12 respectively. It is preferable that voltages which are level-shifted to a voltage level of the positive power source VDD2 should be used for the pulse voltages P11 and P12 in order to reinforce coupling effect. It is also preferable that pulse widths of the pulse voltages P11 and P12 should be equal to or more than a pulse width of the strobe signal.

Waveforms of the pulse voltages P11 and P12 may be generated in synchronization with a clock in the source driver, as a signal synchronized with the strobe signal STB outputted from the outside. Furthermore, control of pulse widths of the pulse voltages P11 and P12 may be performed by a timing controller provided outside or inside the source driver. The above is the description of the configuration of the differential amplifier according to the embodiment of the present invention.

[Operation]

Next, an operation of the differential amplifier with the above configuration according to the embodiment of the present invention will be described. FIG. 6 is a timing chart of the differential amplifier according to the embodiment of the present invention. FIG. 6 shows a waveform of the strobe signal STB, waveforms of the pulse voltages P11 and P12 from the pulse generating circuits PG11 and PG12, waveforms of the bias voltages BP11 and BN11, to which the pulse voltages P11 and P12 are coupled, from the bias circuit 51, and output waveforms from the amplifier output terminals OUT11 in the amplifiers 53 in an even-numbered row and an odd-numbered row.

The polarity inversion operation of a drive voltage outputted from the output amplifier circuit 53 is started with shift of the strobe signal to the high level as the trigger. With reference to FIG. 6, the strobe signal STB rises at time t1. At the time t1, the bias circuit 51 supplies the bias voltages BP11 and BN11 to the output amplifier circuit 53 through the bias lines BL11 and BL12. The pulse generating circuit PG11 generates the pulse voltage P11. The pulse generating circuit PG11 couples the pulse voltage P11 to the bias voltage BP11 through the coupling capacitance CP11. The pulse generating circuit PG12 generates the pulse voltage P12. The pulse generating circuit PG12 couples the pulse voltage P12 to the bias voltage BN11 through the coupling capacitance CP12.

The bias voltage BP11 is shifted to a low voltage side due to the pulse voltage P11. The bias voltage BN11 is shifted to a high voltage side due to the pulse voltage P12. Consequently, it is possible to increase gate voltage levels of the MOS transistor TN11 configuring the constant current source ICS11 and the MOS transistor TP11 configuring the constant current source ICS12 in the output amplifier circuit 53 only for a moment to increase current supplying capacity of the constant current sources ICS11 and ICS12 for a moment. As a result, it is possible to increase a slew rate of a drive voltage outputted from the output amplifier circuit 53, the slew rate being determined by the constant current sources ICS11 and ICS12 and the phase compensation capacitors C11 and C12.

A duration time during which each gate voltage level is high relates to the waveforms of the pulse voltages P11 and P12. The pulse generating circuit PG11 takes a long falling time of the pulse voltage P11, which is longer than a rising time of the pulse voltage P11. On the other hand, the pulse generating circuit PG12 takes a long rising time of the pulse voltage P12, which is longer than a falling time of the pulse voltage P12. The falling time of the pulse voltage P11 and the rising time of the pulse voltage P12 are duration times during which voltage levels of the bias voltages BP11 and BN11 are high respectively.

With reference to FIG. 6, the falling time of the pulse voltage P11 and the rising time of the pulse voltage P12 are from the time t1 to time t2. The bias voltages BP11 and BN11 keep the state where the voltage levels are high, from the time t1 to the time t2. That is to say, the gate voltage levels of the MOS transistors TN11 and TP11 are high from the time t1 to the time t2. The same operation applies to times t3 to t8. The above is the description of the operation of the differential amplifier according to the embodiment of the present invention.

According to the configuration and operation mentioned above, each gate voltage level of the MOS transistor TN11 and the MOS transistor TP11 of the output amplifier circuit 53 is increased for a moment, making it possible to increase current supplying capacity of the constant current sources ICS11 and ICS12 for a moment. Consequently, it is possible to increase a slew rate of a drive voltage outputted from the output amplifier circuit 53, the slew rate being determined by the constant current sources ICS11 and ICS12 and the phase compensation capacitors C11 and C12.

Since coupling using the pulse voltages P11 and P12 is only for a moment, the output amplifier circuit 53 does not oscillate and can stably operate. Additionally, dynamic consumption current is hardly increased since coupling using the pulse voltages P11 and P12 is only for a moment. It is also possible, due to reduction in a delay time as a result of increase in a slew rate, to reduce consumption current of the output amplifier circuit 53 at the time of outputting a gradation voltage thereby reducing heat generation in a chip.

It is apparent that the present invention is not limited to the above embodiment, but may be modified and changed without departing from the scope and spirit of the invention.

Although the present invention has been described above in connection with several embodiments thereof, it would be apparent to those skilled in the art that those embodiments are provided solely for illustrating the present invention, and should not be relied upon to construe the appended claims in a limiting sense.

What is claimed is:

1. A differential amplifier comprising:
   an output amplifier circuit configured to receive a positive gradation voltage and a negative gradation voltage alternately by an input stage circuit and supply a drive voltage generated based on said gradation voltage to a display panel;
   a bias circuit configured to generate a bias voltage in synchronization with a strobe signal which is a trigger for a polarity inverting operation of said gradation voltage and apply said bias voltage to a constant current source controlling a current of said input stage circuit; and
   a pulse applying circuit configured to generate a pulse voltage having a voltage level higher than a voltage level of said bias voltage and couple said pulse voltage to said bias voltage.

2. The differential amplifier according to claim 1, wherein said input stage circuit includes:
   a N-channel MOS transistor as a first constant current source included in said constant current source,
   wherein said pulse applying circuit generates said pulse voltage having a waveform with a rising time longer than a falling time and couples said pulse voltage to said bias voltage to be applied to said N-channel MOS transistor.

3. The differential amplifier according to claim 1, wherein said input stage circuit includes:
   a P-channel MOS transistor as a second constant current source included in said constant current source,
   wherein said pulse applying circuit generates said pulse voltage having a waveform with a falling time longer than a rising time and couples said pulse voltage to said bias voltage to be applied to said P-channel MOS transistor.

4. The differential amplifier according to claim 1, wherein a pulse width of said pulse voltage is equal to or more than a pulse width of said strobe signal.

5. The differential amplifier according to claim 1, wherein said pulse voltage has a voltage level which is level-shifted to a voltage level of a positive power source for said differential amplifier.

6. The differential amplifier according to claim 1, wherein said pulse applying circuit includes:
   a pulse generating circuit configured to generate said pulse voltage in synchronization with said strobe signal, and
   a coupling capacitance configured to couple said pulse voltage to said bias voltage.

7. The differential amplifier according to claim 6, wherein said coupling capacitance includes a parasitic capacitance of a line to which said pulse voltage is applied.

8. A source driver comprising:
   a differential amplifier,
   wherein said differential amplifier includes:
   an output amplifier circuit configured to receive a positive gradation voltage and a negative gradation voltage alternately by an input stage circuit and supply a drive voltage generated based on said gradation voltage to a display panel,
   a bias circuit configured to generate a bias voltage in synchronization with a strobe signal which is a trigger for a polarity inverting operation of said gradation voltage and apply said bias voltage to a constant current source controlling a current of said input stage circuit, and
   a pulse applying circuit configured to generate a pulse voltage having a voltage level higher than a voltage level of said bias voltage and couple said pulse voltage to said bias voltage.

9. The source driver according to claim 8, wherein said input stage circuit includes:
   a N-channel MOS transistor as a first constant current source included in said constant current source,
   wherein said pulse applying circuit generates said pulse voltage having a waveform with a rising time longer than a falling time and couples said pulse voltage to said bias voltage to be applied to said N-channel MOS transistor.

10. The source driver according to claim 8, wherein said input stage circuit includes:
    a P-channel MOS transistor as a second constant current source included in said constant current source,
    wherein said pulse applying circuit generates said pulse voltage having a waveform with a falling time longer than a rising time and couples said pulse voltage to said bias voltage to be applied to said P-channel MOS transistor.

11. The source driver according to claim 8, wherein a pulse width of said pulse voltage is equal to or more than a pulse width of said strobe signal.

12. The source driver according to claim 8, wherein said pulse voltage has a voltage level which is level-shifted to a voltage level of a positive power source for said differential amplifier.

13. The source driver according to claim wherein said pulse applying circuit includes:
    a pulse generating circuit configured to generate said pulse voltage in synchronization with said strobe signal, and
    a coupling capacitance configured to couple said pulse voltage to said bias voltage.

14. The source driver according to claim 13, wherein said coupling capacitance includes a parasitic capacitance of a line to which said pulse voltage is applied.

15. A method for inverting an output polarity of a differential amplifier, comprising:
    generating a drive voltage based on a positive gradation voltage and a negative gradation voltage received alternately by an input stage circuit; supplying said drive voltage to a display panel;
    generating a bias voltage in synchronization with a strobe signal which is a trigger for a polarity inverting operation of said gradation voltage;
    applying said bias voltage to a constant current source controlling a current of said input stage circuit;
    generating a pulse voltage having a voltage level higher than a voltage level of said bias voltage: and
    coupling said pulse voltage to said bias voltage.

16. The method for inverting an output polarity of a differential amplifier according to claim 15, wherein said input stage circuit includes:
    a N-channel MOS transistor as a first constant current source included in said constant current source,
    wherein said generating said pulse voltage step includes:

generating said pulse voltage having a waveform with a rising time longer than a falling time,
wherein said coupling step includes:
coupling said pulse voltage to said bias voltage to be applied to said N-channel MOS transistor.

17. The method for inverting an output polarity of a differential amplifier according to claim 15, wherein said input stage circuit includes:
a P-channel MOS transistor as a second constant current source included in said constant current source,
wherein said generating said pulse voltage step includes:
generating said pulse voltage having a waveform with a falling time longer than a rising time,
wherein said coupling step includes:
coupling said pulse voltage to said bias voltage to be applied to said P-channel MOS transistor.

18. The method for inverting an output polarity of a differential amplifier according to claim 15, wherein said generating said pulse voltage step includes:
generating said pulse voltage in which a pulse width of said pulse voltage is equal to or more than a pulse width of said strobe signal.

19. The method for inverting an output polarity of a differential amplifier according to claim 15, wherein said generating said pulse voltage step includes:
generating said pulse voltage in which said pulse voltage has a voltage level which is level-shifted to a voltage level of a positive power source for said differential amplifier.

* * * * *